United States Patent
Kishimoto et al.

(10) Patent No.: US 12,178,132 B2
(45) Date of Patent: Dec. 24, 2024

(54) PIEZOELECTRIC DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 750 days.

(21) Appl. No.: 17/368,907

(22) Filed: Jul. 7, 2021

(65) Prior Publication Data

US 2021/0343929 A1    Nov. 4, 2021

Related U.S. Application Data

(63) Continuation of application No. PCT/JP2019/037841, filed on Sep. 26, 2019.

(30) Foreign Application Priority Data

Feb. 12, 2019 (JP) .................................. 2019-022827

(51) Int. Cl.
*H01L 41/09* (2006.01)
*H10N 30/072* (2023.01)
(Continued)

(52) U.S. Cl.
CPC ....... *H10N 30/2047* (2023.02); *H10N 30/072* (2023.02); *H10N 30/082* (2023.02); *H10N 30/8542* (2023.02); *H10N 30/877* (2023.02)

(58) Field of Classification Search
CPC .......... H10N 30/2047; H10N 30/8542; H10N 30/877
See application file for complete search history.

(56) References Cited

U.S. PATENT DOCUMENTS

| | | |
|---|---|---|
| 2007/0188270 A1 | 8/2007 | Ohara et al. |
| 2010/0088868 A1* | 4/2010 | Kando ............ H10N 30/05 29/25.35 |

(Continued)

FOREIGN PATENT DOCUMENTS

| | | |
|---|---|---|
| JP | 2007-221189 A | 8/2007 |
| JP | 2008-022305 A | 1/2008 |

(Continued)

OTHER PUBLICATIONS

English Translation of JP 200822305 (Year: 2008).*
Official Communication issued in International Patent Application No. PCT/JP2019/037841, mailed on Nov. 19, 2019.

*Primary Examiner* — Bryan P Gordon
(74) *Attorney, Agent, or Firm* — Keating & Bennett, LLP

(57) ABSTRACT

In a piezoelectric device, a piezoelectric driving portion includes layers and is directly or indirectly supported by a base portion. The piezoelectric driving portion includes a piezoelectric layer, an upper electrode layer, and a lower electrode layer. The upper electrode layer is disposed on the upper side of the piezoelectric layer. The lower electrode layer faces at least a portion of the upper electrode layer with the piezoelectric layer interposed therebetween. The piezoelectric driving portion includes a through groove extending through the piezoelectric driving portion in the vertical direction, so that a pair of inner side surfaces are provided. The pair of inner side surfaces each include a first small-width portion in which the width of the through groove decreases in a downward direction from an upper end surface of the piezoelectric layer.

16 Claims, 12 Drawing Sheets

(51) Int. Cl.
    *H10N 30/082*     (2023.01)
    *H10N 30/20*     (2023.01)
    *H10N 30/853*     (2023.01)
    *H10N 30/87*     (2023.01)

(56) References Cited

U.S. PATENT DOCUMENTS

| | | | | |
|---|---|---|---|---|
| 2011/0279187 | A1* | 11/2011 | Ballandras | H03H 9/02031 29/25.35 |
| 2019/0193116 | A1* | 6/2019 | Horsley | G10K 9/122 |
| 2020/0313073 | A1* | 10/2020 | Wang | H10N 30/06 |
| 2021/0028763 | A1* | 1/2021 | Kawai | H10N 30/87 |
| 2021/0143315 | A1* | 5/2021 | Kishimoto | H10N 30/074 |

FOREIGN PATENT DOCUMENTS

| | | |
|---|---|---|
| JP | 2011-523828 A | 8/2011 |
| WO | 2009/081651 A1 | 7/2009 |
| WO | 2017/218299 A | 12/2017 |
| WO | 2019211926 A1 | 11/2019 |

* cited by examiner

PIEZOELECTRIC DEVICE

CROSS REFERENCE TO RELATED APPLICATIONS

This application claims the benefit of priority to Japanese Patent Application No. 2019-022827 filed on Feb. 12, 2019 and is a Continuation Application of PCT Application No. PCT/JP2019/037841 filed on Sep. 26, 2019. The entire contents of each application are hereby incorporated herein by reference.

BACKGROUND OF THE INVENTION

1. Field of the Invention

The present invention relates to a piezoelectric device.

2. Description of the Related Art

International Publication No. 2017/218299 is one of the patent documents disclosing a configuration of a piezoelectric device. The piezoelectric device described in International Publication No. 2017/218299 includes a substrate and a membrane portion. The substrate has a cavity that is formed so as to extend therethrough. The membrane portion includes at least one elastic layer and at least one piezoelectric layer that is sandwiched between an upper electrode layer and a lower electrode layer. The membrane portion is attached to the substrate at a position above the cavity. By etching the membrane portion near an end of the cavity, a through groove is formed.

In a piezoelectric device in which a through groove is formed in a piezoelectric driving portion including a piezoelectric layer, its temperature rises at the time of driving. In this case, if the thermal expansion coefficient of the piezoelectric layer in the vertical direction and the thermal expansion coefficient of the piezoelectric layer in the horizontal direction are different from each other, deformation occurs in a portion of the piezoelectric driving portion that faces the through groove. As a result, the axial direction of the polarization axis of the piezoelectric layer is disturbed, and the electrical characteristics of the piezoelectric device are deteriorated.

SUMMARY OF THE INVENTION

Preferred embodiments of the present invention provide piezoelectric devices in each of which deterioration of the electrical characteristics thereof is reduced or prevented by reducing deformation of a portion of the piezoelectric driving portion that faces a through groove.

A piezoelectric device according to a preferred embodiment of the present invention includes a base portion and a piezoelectric driving portion. The piezoelectric driving portion includes a plurality of layers and is directly or indirectly supported by the base portion. The piezoelectric driving portion includes a piezoelectric layer, an upper electrode layer, and a lower electrode layer. The upper electrode layer is on the upper side of the piezoelectric layer. The lower electrode layer faces at least a portion of the upper electrode layer with the piezoelectric layer interposed between the lower electrode layer and the upper electrode layer. In the piezoelectric driving portion, a through groove extends through the piezoelectric driving portion in a vertical direction, so that a pair of inner side surfaces are provided. The pair of inner side surfaces each include a first small-width portion in which the width of the through groove decreases in a downward direction from an upper end surface of the piezoelectric layer.

Deterioration of the electrical characteristics of such piezoelectric devices can be reduced or prevented by reducing deformation of a portion of a piezoelectric driving portion facing a through groove.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
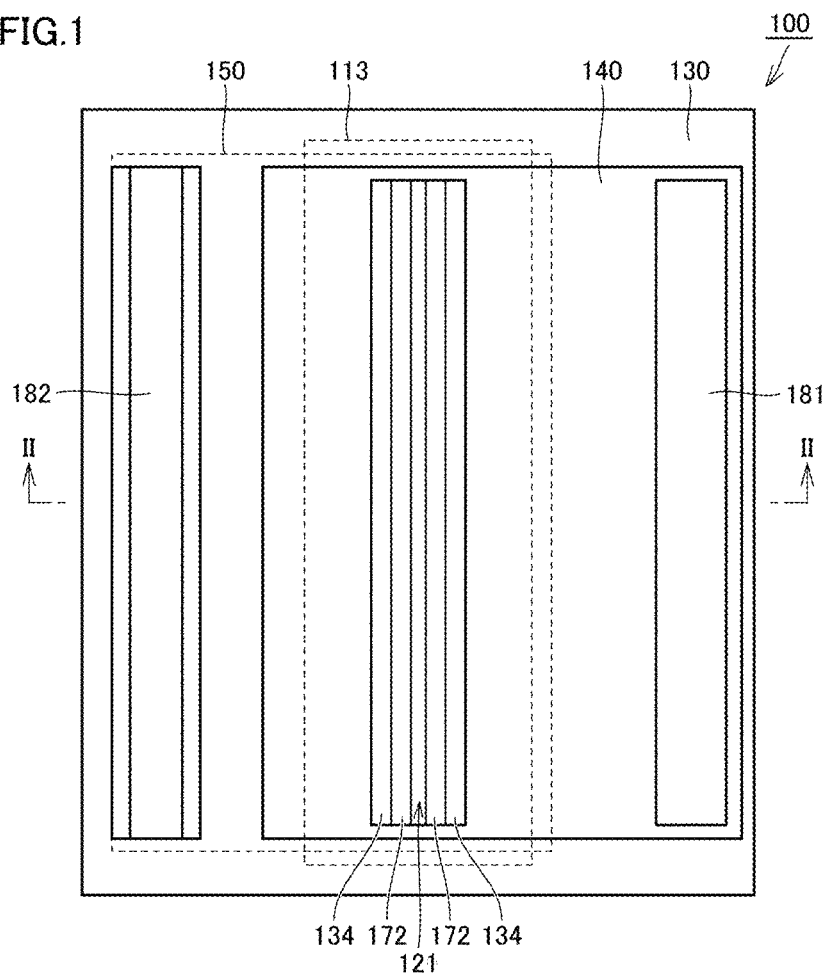
FIG. 1 is a plan view of a piezoelectric device according to a first preferred embodiment of the present invention.

Piezoelectric devices according to preferred embodiments of the present invention will be described below with reference to the drawings. In the following descriptions of the preferred embodiments, portions that are the same as or similar to each other or that correspond to each other in the drawings are denoted by the same reference signs, and repeated descriptions will be avoided.

First Preferred Embodiment

Figure 2:
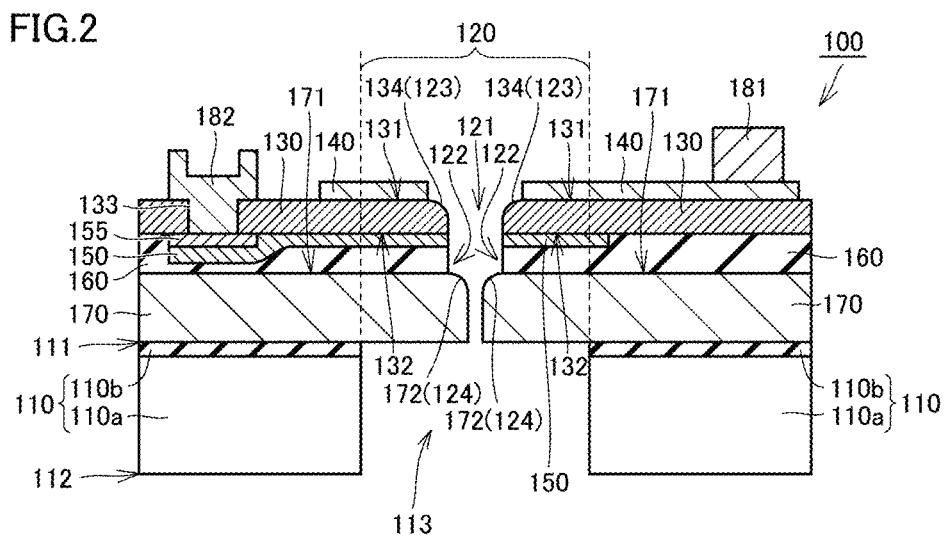
FIG. 2 is a cross-sectional view of the piezoelectric device taken along line II-II of FIG. 1.

FIG. 1 is a plan view of a piezoelectric device according to a first preferred embodiment of the present invention. FIG. 2 is a cross-sectional view of the piezoelectric device taken along line II-II of FIG. 1. In FIG. 1, an internal configuration of the piezoelectric device is indicated by a dotted line.

As illustrated in FIG. 1 and FIG. 2, a piezoelectric device 100 according to the first preferred embodiment of the present invention includes a base portion 110 and a piezoelectric driving portion 120.

As illustrated in FIG. 2, the base portion 110 includes a lower base portion 110a and an upper base portion 110b that is located on the upper side of the lower base portion 110a. The base portion 110 includes an upper main surface 111 and a lower main surface 112 that is opposite to the upper main surface 111.

In the present preferred embodiment, the upper surface of the upper base portion 110b is the upper main surface 111, and the lower surface of the lower base portion 110a is the lower main surface 112. The base portion 110 includes a cavity 113 that extends through the lower base portion 110a and the upper base portion 110b in the vertical direction.

The material of the base portion 110 is not particularly limited. In the present preferred embodiment, the lower base portion 110a is made of Si, for example. The upper base portion 110b is made of $SiO_2$, for example.

As illustrated in FIG. 2, a plurality of layers are laminated on the upper main surface 111 of the base portion 110. In the present preferred embodiment, the piezoelectric driving portion 120 includes portions of the plurality of layers, the portions being located above the cavity 113. In other words, the piezoelectric driving portion 120 includes the plurality of layers.

In the present preferred embodiment, since the piezoelectric driving portion 120 is located on the upper side of the cavity 113 of the base portion 110, the piezoelectric driving portion 120 does not overlap the base portion 110. In other words, the piezoelectric driving portion 120 is indirectly supported by the base portion 110 and is positioned above the base portion 110. That is to say, in the present preferred embodiment, the piezoelectric driving portion 120 includes a membrane structure. Note that the piezoelectric driving portion 120 may be directly supported by the base portion 110.

As illustrated in FIG. 2, in the present preferred embodiment, the plurality of layers of the piezoelectric driving portion 120 include a piezoelectric layer 130, an upper electrode layer 140, a lower electrode layer 150, an intermediate layer 160, and an active layer 170.

The piezoelectric layer 130 is positioned above the base portion 110. The piezoelectric layer 130 is disposed in such a manner that a portion of the piezoelectric layer 130 is included in the piezoelectric driving portion 120. An upper end surface 131 and a lower end surface 132 of the piezoelectric layer 130 are each flat.

The piezoelectric layer 130 includes a hole 133 that is different from a through groove, which will be described later. The hole 133 extends through the piezoelectric layer 130 in the vertical direction. In the present preferred embodiment, the hole 133 is positioned above the base portion 110 and is not included in the piezoelectric driving portion 120.

In the present preferred embodiment, the piezoelectric layer 130 is made of a single-crystal piezoelectric material, and more specifically, the piezoelectric layer 130 is made of lithium tantalate or lithium niobate, for example. A single-crystal piezoelectric material such as, for example, lithium tantalate or lithium niobate has a unidirectional polarization axis.

The axial direction of the polarization axis of the single-crystal piezoelectric material is inclined with respect to the lamination direction of the piezoelectric driving portion 120. In addition, the axial direction of the polarization axis of the single-crystal piezoelectric material is not perpendicular or substantially perpendicular to the lamination direction of the piezoelectric driving portion 120. In other words, in the present preferred embodiment, the piezoelectric layer 130 is made of a rotated Y-cut single-crystal piezoelectric material, for example.

In the present preferred embodiment, since the piezoelectric layer 130 is made of a single-crystal piezoelectric material, the thermal expansion coefficient of the piezoelectric layer 130 in the lamination direction of the piezoelectric driving portion 120 and the thermal expansion coefficient of the piezoelectric layer 130 in a planar direction are different from each other.

Note that the piezoelectric layer 130 does not need to be made of a single-crystal piezoelectric material. Even in the case where the piezoelectric layer 130 is not made of a single-crystal piezoelectric material, the piezoelectric layer 130 may be structured such that the thermal expansion coefficient of the piezoelectric layer 130 in the lamination direction of the piezoelectric driving portion 120 and the thermal expansion coefficient of the piezoelectric layer 130 in the planar direction are different from each other.

The upper electrode layer 140 is disposed on the upper side of the piezoelectric layer 130. The upper electrode layer 140 is disposed such that a portion of the upper electrode layer 140 is included in the piezoelectric driving portion 120.

In the present preferred embodiment, the upper electrode layer 140 is laminated on the upper side of a portion of the piezoelectric layer 130. Note that a close-contact layer that is made of, for example, Ti or NiCr may be provided between the upper electrode layer 140 and the piezoelectric layer 130.

The lower electrode layer 150 faces at least a portion of the upper electrode layer 140 with the piezoelectric layer 130 interposed therebetween. The lower electrode layer 150 is disposed such that a portion of the lower electrode layer 150 is included in the piezoelectric driving portion 120. In addition, in the piezoelectric driving portion 120, the lower electrode layer 150 faces at least a portion of the upper electrode layer 140 with the piezoelectric layer 130 interposed therebetween. Note that a close-contact layer that is made of, for example, Ti or NiCr may be provided between the lower electrode layer 150 and the piezoelectric layer 130.

A portion of the lower electrode layer 150 is positioned below the hole 133 in the piezoelectric layer 130. In the present preferred embodiment, the lower electrode layer 150 is connected to the piezoelectric layer 130 via an etching stop layer 155. The etching stop layer 155 covers the hole 133 of the piezoelectric layer 130 from below.

In the present preferred embodiment, a portion of the lower electrode layer 150 is disposed on the lower side of the etching stop layer 155 so as to cover the lower surface of the etching stop layer 155. The etching stop layer 155 is not included in the piezoelectric driving portion 120. Note that the etching stop layer 155 does not need to be provided. In the case where the etching stop layer 155 is not provided, a portion of the lower electrode layer 150 directly covers the hole 133 from below.

The lower electrode layer 150 is made of an electrically conductive material such as Pt, Ni, or Au, for example. It is preferable that the material of the etching stop layer 155 is a material that has electrical conductivity and that will not be etched when the piezoelectric layer is etched. The etching stop layer 155 is made of, for example, Ni.

The intermediate layer 160 is disposed below the piezoelectric layer 130. In the present preferred embodiment, the intermediate layer 160 is provided so as to be in contact with the lower surface of the lower electrode layer 150 and a portion of the lower surface of the piezoelectric layer 130 that is not covered with the lower electrode layer 150. The lower surface of the intermediate layer 160 is flat.

The material of the intermediate layer 160 is not particularly limited as long as it is an insulating material. In the present preferred embodiment, the intermediate layer 160 is made of $SiO_2$, for example. In addition, the intermediate layer 160 may be made of an organic material having an electrical insulating property and heat insulation property, for example.

The active layer 170 is connected to the entire or substantially the entire lower surface of the intermediate layer 160. In other words, the active layer 170 is positioned below the lower electrode layer 150 and the piezoelectric layer 130.

The active layer 170 is laminated on the upper main surface 111 of the base portion 110 so as to cover the cavity 113 from above. In other words, in the present preferred embodiment, the lower surface of the active layer 170 is exposed through the cavity 113.

Although the material of the active layer 170 is not particularly limited, the active layer 170 is made of Si, for example, in the present preferred embodiment.

The piezoelectric device 100 further includes a first outer electrode layer 181 and a second outer electrode layer 182. The first outer electrode layer 181 is laminated on the upper side of a portion of the upper electrode layer 140. The second outer electrode layer 182 is laminated on the upper side of a portion of the piezoelectric layer 130 and on the upper side of the etching stop layer 155. In other words, in the hole 133, the second outer electrode layer 182 is laminated on the upper side of the lower electrode layer 150 with the etching stop layer 155 interposed therebetween. Note that a two-layer wiring line may be laminated as the lower electrode layer 150. The first outer electrode layer 181 and the second outer electrode layer 182 are not included in the piezoelectric driving portion 120.

As described above, the piezoelectric driving portion 120 includes the piezoelectric layer 130, the upper electrode layer 140, the lower electrode layer 150, the intermediate layer 160, and the active layer 170.

As illustrated in FIG. 2, in the piezoelectric driving portion 120, the upper electrode layer 140 is disposed on the upper side of the piezoelectric layer 130. In the piezoelectric driving portion 120, the lower electrode layer 150 faces at least a portion of the upper electrode layer 140 with the piezoelectric layer 130 interposed therebetween.

With the above-described configuration, a voltage is applied between the upper electrode layer 140 and the lower electrode layer 150, so that bending vibration in the vertical direction is generated in the piezoelectric driving portion 120 in response to expansion and contraction of the piezoelectric layer 130.

As illustrated in FIG. 1 and FIG. 2, the piezoelectric driving portion 120 includes a through groove 121 that extends therethrough in the vertical direction. As a result of the through groove 121 in the piezoelectric driving portion 120, a pair of inner side surfaces 122 are provided in the piezoelectric driving portion 120.

As illustrated in FIG. 2, the pair of inner side surfaces 122 each include a first small-width portion 123 in which the width of the through groove 121 gradually decreases in a downward direction from the upper end surface 131 of the piezoelectric layer 130. In the present preferred embodiment, portions of the pair of inner side surfaces 122 in the piezoelectric layer 130 are include the first small-width portions 123. In the pair of inner side surfaces 122 in the piezoelectric layer 130, portions that are located below the first small-width portions 123 extend in the vertical direction. Note that the pair of inner side surfaces 122 in the piezoelectric layer 130 may be entirely or substantially entirely defined by the first small-width portions 123.

In the present preferred embodiment, the piezoelectric layer 130 includes first corner portions 134 each of which is contiguous to the upper end surface 131 of the piezoelectric layer 130 and each of which defines at least a portion of one of the first small-width portions 123. Each of the first corner portions 134 is curved obliquely upward in a convex manner. In the present preferred embodiment, each of the first small-width portions 123 may be entirely or substantially entirely defined by the corresponding first corner portion 134.

Note that each of the first corner portions 134 may partially define the corresponding first small-width portion 123. In this case, a portion of the first small-width portion 123 that is located below the first corner portion 134 may include an inclined surface.

In addition, also in the inner side surfaces of the hole 133, corner portions each of which is contiguous to the upper end surface 131 of the piezoelectric layer 130 and each of which defines a portion of one of the inner side surfaces of the hole 133 may be curved obliquely upward in a convex manner.

In the piezoelectric driving portion 120, the upper electrode layer 140 is disposed on the upper end surface 131 of the piezoelectric layer 130. In the present preferred embodiment, the upper end surface 131 of the piezoelectric layer 130 is not exposed as the pair of inner side surfaces 122.

In the piezoelectric driving portion 120, the lower electrode layer 150 defines portions of the pair of inner side surfaces 122. The portions of the pair of inner side surfaces 122 that include the lower electrode layer 150 extend in the vertical direction and are connected to the portions of the pair of inner side surfaces 122 that are included in the piezoelectric layer 130 in the vertical direction.

In the piezoelectric driving portion 120, the intermediate layer 160 defines portions of the pair of inner side surfaces 122. The portions of the pair of inner side surfaces 122 that include the intermediate layer 160 extend in the vertical direction and are connected to the portions of the pair of inner side surfaces 122 that include the lower electrode layer 150 in the vertical direction.

Note that the lower electrode layer 150 does not need to define portions of the pair of inner side surfaces 122. In this case, the portions of the pair of inner side surfaces 122 that are included in the piezoelectric layer 130 are connected to the portions of the pair of inner side surfaces 122 that include the intermediate layer 160 in the vertical direction.

As illustrated in FIG. 2, each of the pair of inner side surfaces 122 further includes a second small-width portion 124 in which the width of the through groove 121 gradually decreases in the downward direction from an upper end surface of the active layer 170. In the present preferred embodiment, portions of the pair of inner side surfaces 122 that are included in the active layer 170 are defined by the second small-width portions 124. In the pair of inner side surfaces 122 in the active layer 170, portions that are located below the second small-width portions 124 extend in the vertical direction. Note that the pair of inner side surfaces 122 in the active layer 170 may be entirely or substantially entirely defined by the second small-width portions 124.

In the present preferred embodiment, the active layer 170 includes second corner portions 172 each of which is contiguous to an upper end surface 171 of the active layer 170 and each of which defines at least a portion of one of the second small-width portions 124. Each of the second corner portions 172 is curved obliquely upward in a convex manner. In the present preferred embodiment, each of the second small-width portions 124 may be entirely or substantially entirely defined by the corresponding second corner portion 172.

Note that each of the second corner portions 172 may partially define the corresponding second small-width portion 124. In this case, a portion of the second small-width portion 124 that is located below the second corner portion 172 may include an inclined surface.

The radius of curvature of each of the first corner portions 134 and the radius of curvature of each of the second corner portions 172 are different from each other. In the present preferred embodiment, the radius of curvature of each of the first corner portions 134 is larger than the radius of curvature of each of the second corner portions 172. Note that the radius of curvature of each of the first corner portions 134 may be smaller than the radius of curvature of each of the second corner portions 172.

In the piezoelectric driving portion 120, the intermediate layer 160 is disposed on the upper end surface 171 of the active layer 170. In the present preferred embodiment, the upper end surface 171 of the active layer 170 is not exposed as the pair of inner side surfaces 122. In other words, in the present preferred embodiment, the upper end surface 171 of the active layer 170 does not define the pair of inner side surfaces 122.

An end portion of the through groove 121 on the side on which the cavity 113 is present is located at the lower surface of the active layer 170. The through groove 121 is structured such that the end portion thereof on the side on which the cavity 113 is present has the smallest width. As described above, in the present preferred embodiment, the width of the through groove 121 decreases in a stepwise manner from the upper end of the through groove 121 toward the lower end of the through groove 121.

A non-limiting example of a method for manufacturing the piezoelectric device according to the first preferred embodiment of the present invention will be described below.

Figure 3:
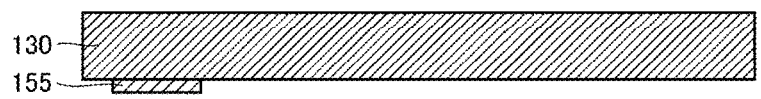
FIG. 3 is a cross-sectional view illustrating a state where an etching stop layer is provided on the lower surface of a piezoelectric layer in a method for manufacturing the piezoelectric device according to the first preferred embodiment of the present invention.

FIG. 3 is a cross-sectional view illustrating a state where an etching stop layer is provided on the lower surface of a piezoelectric layer in the method for manufacturing the piezoelectric device according to the first preferred embodiment of the present invention. As illustrated in FIG. 3, the etching stop layer 155 is provided on the lower surface of the piezoelectric layer 130 by a lift-off method, a plating method, an etching method, or the like, for example.

Figure 4:
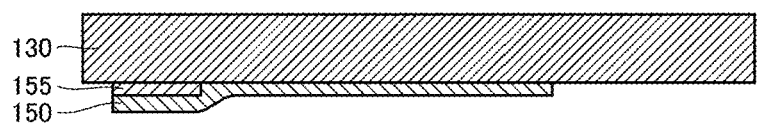
FIG. 4 is a cross-sectional view illustrating a state where a lower electrode layer is provided on the lower surface of the etching stop layer and the lower surface of the piezoelectric layer in the method for manufacturing the piezoelectric device according to the first preferred embodiment of the present invention.

FIG. 4 is a cross-sectional view illustrating a state where a lower electrode layer is provided on the lower surface of the etching stop layer and the lower surface of the piezoelectric layer in the method for manufacturing the piezoelectric device according to the first preferred embodiment of the present invention. As illustrated in FIG. 4, the lower electrode layer 150 is provided on the entire or substantially the entire lower surface of the etching-stop layer 155 and a portion of the lower surface of the piezoelectric layer by the lift-off method, the plating method, the etching method, or the like.

Figure 5:
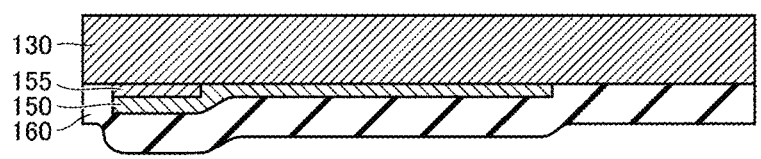
FIG. 5 is a cross-sectional view illustrating a state where an intermediate layer is provided on the lower surface of the lower electrode layer and the lower surface of the piezoelectric layer in the method for manufacturing the piezoelectric device according to the first preferred embodiment of the present invention.

FIG. 5 is a cross-sectional view illustrating a state where an intermediate layer is provided on the lower surface of the lower electrode layer and the lower surface of the piezoelectric layer in the method for manufacturing the piezoelectric device according to the first preferred embodiment of the present invention. As illustrated in FIG. 5, the intermediate layer 160 is provided on the lower surface of the lower electrode layer 150 and the lower surface of the piezoelectric layer 130 by a chemical vapor deposition (CVD) method, a physical vapor deposition (PVD) method, or the like, for example.

Figure 6:
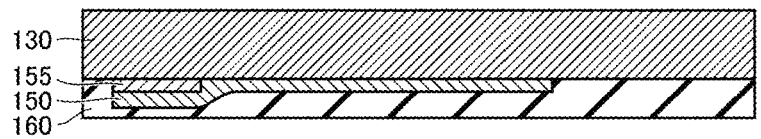
FIG. 6 is a cross-sectional view illustrating a state where the lower surface of the intermediate layer is formed flat in the method for manufacturing the piezoelectric device according to the first preferred embodiment of the present invention.

FIG. 6 is a cross-sectional view illustrating a state where the lower surface of the intermediate layer is flat in the method for manufacturing the piezoelectric device according to the first preferred embodiment of the present invention. As illustrated in FIG. 6, the lower surface of the intermediate layer 160 is formed flat by chemical mechanical polishing (CMP) or the like, for example.

Figure 7:
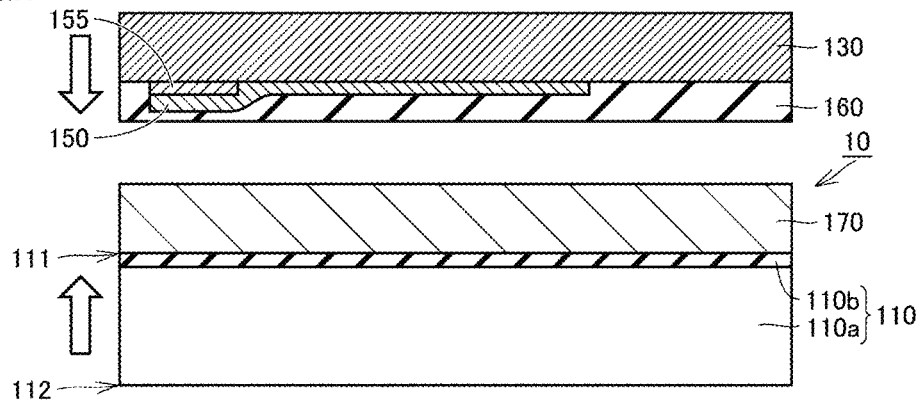
FIG. 7 is a cross-sectional view illustrating a state where a multilayer body is to be joined to the plurality of layers illustrated in FIG. 6 in the method for manufacturing the piezoelectric device according to the first preferred embodiment of the present invention.
Figure 8:
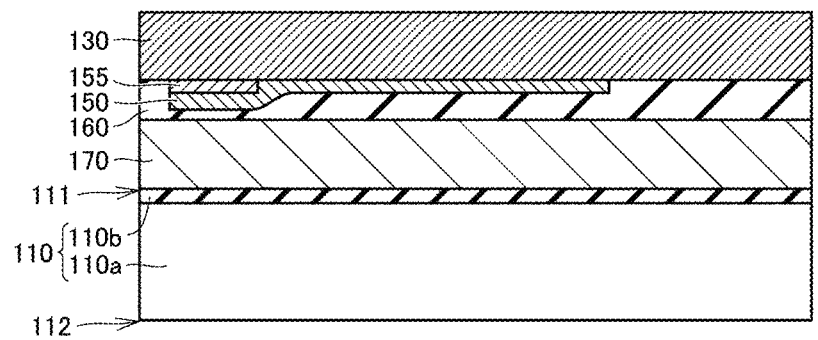
FIG. 8 is a cross-sectional view illustrating a state where the multilayer body is joined to the lower surface of the intermediate layer in the method for manufacturing the piezoelectric device according to the first preferred embodiment of the present invention.

FIG. 7 is a cross-sectional view illustrating a state where a multilayer body is to be joined to the plurality of layers illustrated in FIG. 6 in the method for manufacturing the piezoelectric device according to the first preferred embodiment of the present invention. FIG. 8 is a cross-sectional view illustrating a state where the multilayer body is joined to the lower surface of the intermediate layer in the method for manufacturing the piezoelectric device according to the first preferred embodiment of the present invention.

As illustrated in FIG. 7 and FIG. 8, a multilayer body 10 is joined to the lower surface of the intermediate layer 160. The multilayer body 10 is formed of the base portion 110 in which the cavity 113 is not formed and the active layer 170 joined to the upper surface of the base portion 110. In the present preferred embodiment, the multilayer body 10 is a silicon-on-insulator (SOI) substrate, for example.

Figure 9:
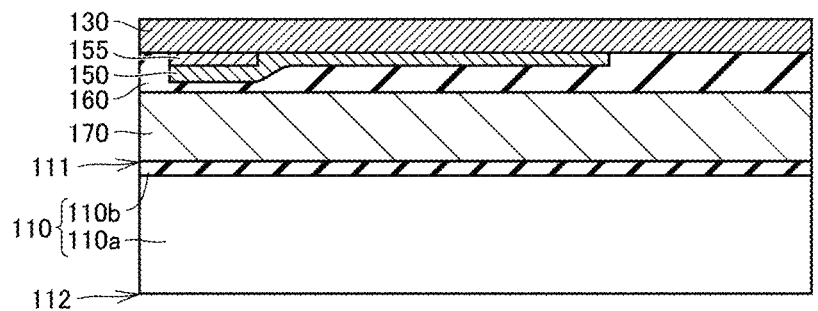
FIG. 9 is a cross-sectional view illustrating a state where the upper surface of the piezoelectric layer is ground in the method for manufacturing the piezoelectric device according to the first preferred embodiment of the present invention.

FIG. 9 is a cross-sectional view illustrating a state where the upper surface of the piezoelectric layer is ground in the method for manufacturing the piezoelectric device according to the first preferred embodiment of the present invention. As illustrated in FIG. 9, the upper surface of the piezoelectric layer 130 is ground by CMP or the like, for example, such that the piezoelectric layer 130 has a desired thickness. In this case, the thickness of the piezoelectric layer 130 is adjusted so as to obtain a desired amount of expansion and contraction of the piezoelectric layer 130 as a result of a voltage being applied thereto.

Figure 10:
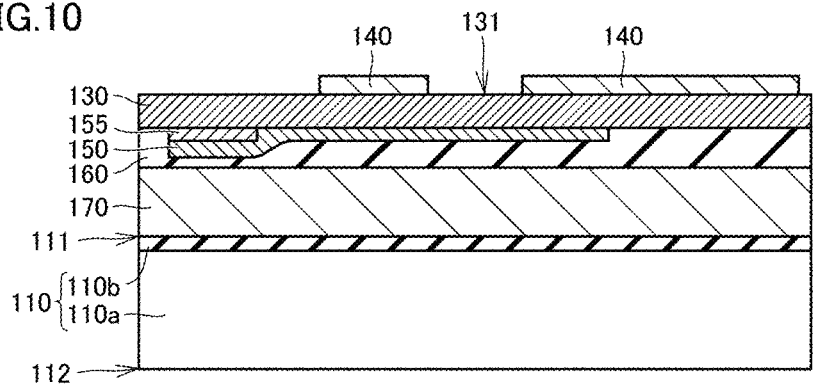
FIG. 10 is a cross-sectional view illustrating a state where an upper electrode layer is provided on the upper end surface of the piezoelectric layer in the method for manufacturing the piezoelectric device according to the first preferred embodiment of the present invention.

FIG. 10 is a cross-sectional view illustrating a state where an upper electrode layer is provided on the upper end surface of the piezoelectric layer in the method for manufacturing the piezoelectric device according to the first preferred embodiment of the present invention. As illustrated in FIG. 10, the upper electrode layer 140 is provided on a portion of the upper end surface 131 of the piezoelectric layer 130 by the lift-off method, the plating method, the etching method, or the like, for example.

Figure 11:
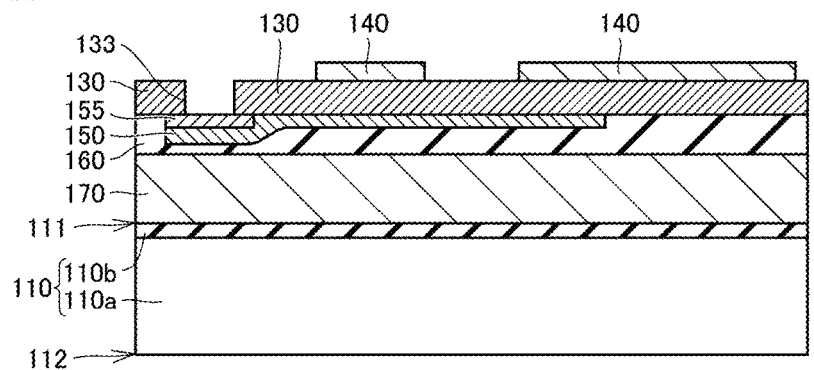
FIG. 11 is a cross-sectional view illustrating a state where a hole is formed in the piezoelectric layer in the method for manufacturing the piezoelectric device according to the first preferred embodiment of the present invention.

FIG. 11 is a cross-sectional view illustrating a state where a hole is formed in the piezoelectric layer in the method for manufacturing the piezoelectric device according to the first preferred embodiment of the present invention. As illustrated in FIG. 11, the hole 133 is formed by etching a portion of the piezoelectric layer 130.

Figure 12:
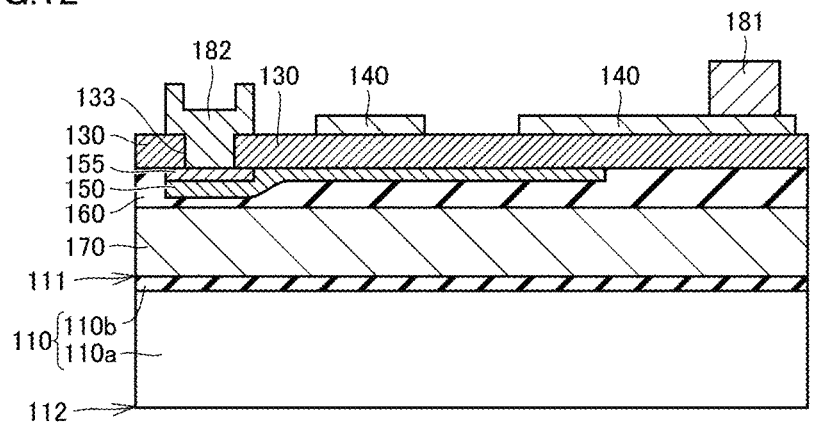
FIG. 12 is a cross-sectional view illustrating a state where a first outer electrode layer and a second outer electrode layer are provided in the method for manufacturing the piezoelectric device according to the first preferred embodiment of the present invention.

FIG. 12 is a cross-sectional view illustrating a state where a first outer electrode layer and a second outer electrode layer are provided in the method for manufacturing the piezoelectric device according to the first preferred embodiment of the present invention. As illustrated in FIG. 12, the first outer electrode layer 181 and the second outer electrode layer 182 are each provided by the lift-off method, the plating method, the etching method, or the like, for example.

Figure 13:
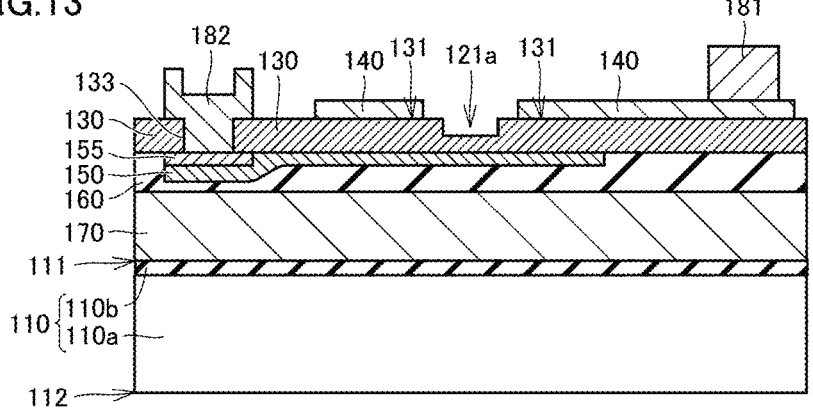
FIG. 13 is a cross-sectional view illustrating a state where a recess is formed in the piezoelectric layer in order to form a through groove in the method for manufacturing the piezoelectric device according to the first preferred embodiment of the present invention.

FIG. 13 is a cross-sectional view illustrating a state where a recess is formed in the piezoelectric layer in order to form a through groove in the method for manufacturing the piezoelectric device according to the first preferred embodiment of the present invention. As illustrated in FIG. 13, a recess 121a is formed in the piezoelectric layer 130 by etching a portion of the piezoelectric layer 130. The recess 121a corresponds to a portion of the through groove 121 of the piezoelectric device 100 according to the present preferred embodiment.

After the recess 121a has been formed in the piezoelectric layer 130, a photoresist applied to the piezoelectric layer 130 and the other members in order to perform the etching is removed.

Note that, in the present preferred embodiment, although the recess 121a is formed only in the piezoelectric layer 130 in order to form the through groove 121, the bottom surface of the recess 121a may be located at the lower electrode layer 150 or may be located at a portion of the intermediate layer 160 that is above the lower end surface of the intermediate layer 160.

Figure 14:
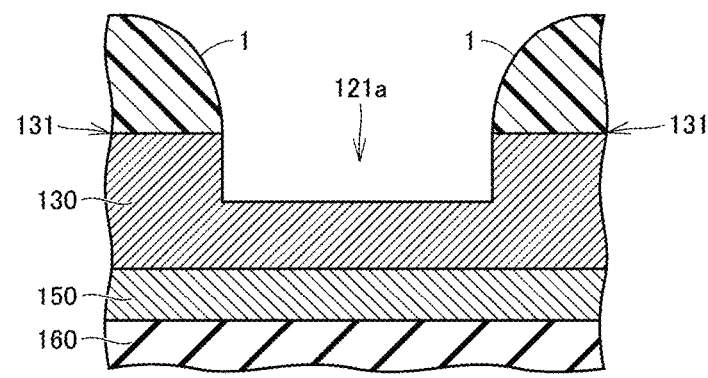
FIG. 14 is an enlarged cross-sectional view of the vicinity of the recess illustrating a state where a photoresist is applied to the upper end surface of the piezoelectric layer in which the recess has been formed in the method for manufacturing the piezoelectric device according to the first preferred embodiment of the present invention.

FIG. 14 is an enlarged cross-sectional view of the vicinity of the recess illustrating a state where a photoresist is applied to the upper end surface of the piezoelectric layer in which the recess has been formed in the method for manufacturing the piezoelectric device according to the first preferred embodiment of the present invention. As illustrated in FIG. 14, in the method for manufacturing the piezoelectric device 100 according to the present preferred embodiment, a photoresist 1 is provided on at least portions of the upper end surface 131 of the piezoelectric layer 130 that are adjacent to the recess 121a. The photoresist 1 is not provided in the recess 121a.

As illustrated in FIG. 14, the photoresist 1 includes a through groove that is formed above the recess 121a so as to be contiguous to the recess 121a. The through groove formed in the photoresist 1 includes a portion in which the width of the through groove gradually decreases in the downward direction. In other words, in a surface direction of the upper end surface 131 of the piezoelectric layer 130, the thickness of the photoresist 1 decreases with decreasing distance from the recess 121a.

In the present preferred embodiment, a pair of inner side surfaces are formed in the photoresist 1 as a result of the through groove being formed in the photoresist 1, and the pair of inner side surfaces formed in the photoresist 1 each include a portion that is curved obliquely upward in a convex manner.

Next, the depth of the recess 121a is increased by performing dry etching in a state where the photoresist 1 is provided. In addition, in the dry etching, the outer surface of the photoresist 1 is melted. As a result of the photoresist 1 whose thickness decreases with decreasing distance from the recess 121a being melted, the portions of the upper end surface 131 of the piezoelectric layer 130 that are adjacent to the recess 121a are exposed first. Then, the upper end surface 131 of the piezoelectric layer 130 is gradually exposed to the outside starting from a portion thereof in the vicinity of the recess 121a. As a result, upper end corners of the recess 121a in the piezoelectric layer 130 are chamfered, so that the first corner portions 134 are formed.

Figure 15:
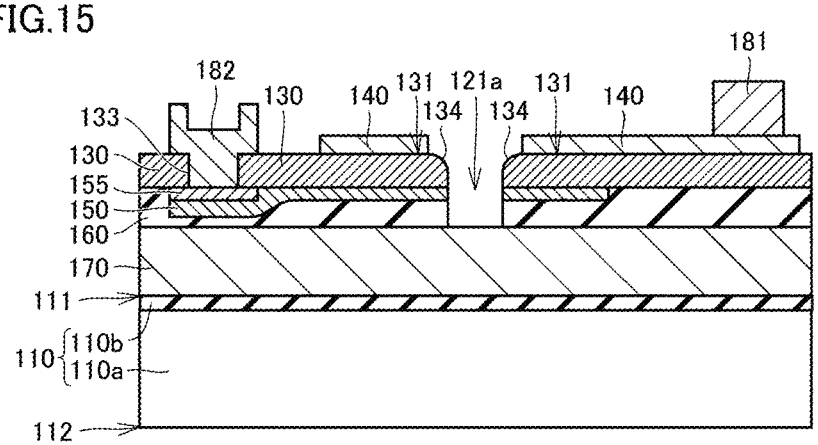
FIG. 15 is a diagram illustrating a state where the recess is extended to the upper end surface of an active layer in the method for manufacturing the piezoelectric device according to the first preferred embodiment of the present invention.

FIG. 15 is a diagram illustrating a state where the recess is extended to the upper end surface of the active layer in the method for manufacturing the piezoelectric device according to the first preferred embodiment of the present invention. By performing the dry etching in a state where the photoresist 1 is provided, as illustrated in FIG. 15, the first corner portions 134 are formed, and the recess 121a is extended until the recess 121a reaches the upper end surface 171 of the active layer 170.

As illustrated in FIG. 14 and FIG. 15, the upper end corners of the recess 121a are chamfered, and thus, each of the first corner portions 134 has an external shape that follows the external shape of the portion of the photoresist 1 that is adjacent to the recess 121a.

Figure 16:
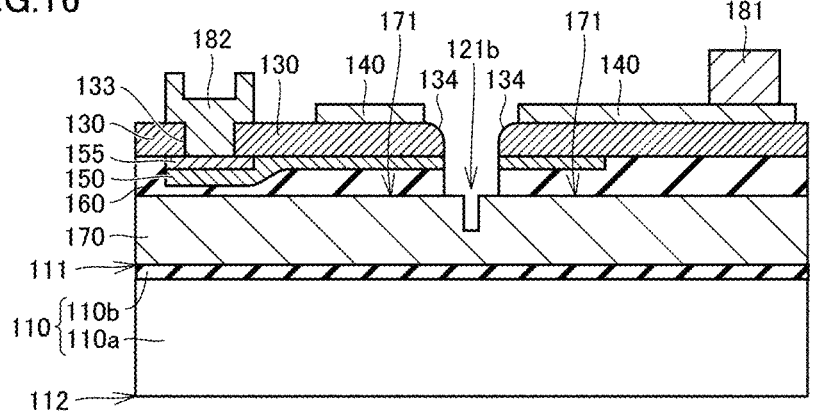
FIG. 16 is a cross-sectional view illustrating a state where a recess is formed in the active layer in order to form the through groove in the method for manufacturing the piezoelectric device according to the first preferred embodiment of the present invention.

FIG. 16 is a cross-sectional view illustrating a state where a recess is formed in the active layer in order to form the through groove in the method for manufacturing the piezoelectric device according to the first preferred embodiment of the present invention. As illustrated in FIG. 16, by etching a portion of the active layer 170 from the upper end surface 171 of the active layer 170 defining or functioning as the bottom surface of the recess 121a, a recess 121b is formed in the active layer 170. The recess 121b corresponds to a portion of the through groove 121 of the piezoelectric device 100 according to the first preferred embodiment of the present invention.

After the recess 121b has been formed in the active layer 170, a resist applied to the active layer 170 and the other members in order to perform the etching is removed.

Note that, in the present preferred embodiment, although the recess 121b is formed only in the active layer 170 in order to form the through groove 121, the bottom surface of the recess 121b may be located in the upper base portion 110b or the lower base portion 110a.

Figure 17:
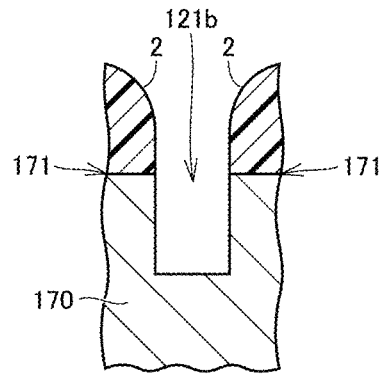
FIG. 17 is an enlarged cross-sectional view of the vicinity of the recess illustrating a state where a photoresist is applied to the upper end surface of the active layer in which the recess has been formed in the method for manufacturing the piezoelectric device according to the first preferred embodiment of the present invention.

FIG. 17 is an enlarged cross-sectional view of the vicinity of the recess illustrating a state where a photoresist is applied to the upper end surface of the active layer in which the recess has been formed in the method for manufacturing the piezoelectric device according to the first preferred embodiment of the present invention. As illustrated in FIG. 17, in the method for manufacturing the piezoelectric device 100 according to the present preferred embodiment, a photoresist 2 is provided on at least portions of the upper end surface 171 of the active layer 170 that are adjacent to the recess 121b. The photoresist 2 is not provided in the recess 121b.

As illustrated in FIG. 17, the photoresist 2 includes a through groove that is formed above the recess 121b so as to be contiguous to the recess 121b. The through groove formed in the photoresist 2 includes a portion in which the width of the through groove gradually decreases in the downward direction from the side opposite to the side on which the active layer 170 is present. In other words, in a surface direction of the upper end surface 131 of the active layer 170, the thickness of the photoresist 2 decreases with decreasing distance from the recess 121b.

In the present preferred embodiment, a pair of inner side surfaces are formed in the photoresist 2 as a result of the through groove being formed in the photoresist 2, and the pair of inner side surfaces formed in the photoresist 2 each include a portion that is curved obliquely upward in a convex manner.

Next, the depth of the recess 121b is increased by performing dry etching in a state where the photoresist 2 is provided. In addition, in this dry etching, the outer surface of the photoresist 2 is melted. As a result of the photoresist 2 whose thickness decreases with decreasing distance from the recess 121b being melted, the portions of the upper end surface 171 of the active layer 170 that are adjacent to the recess 121*b* are exposed first. Then, the upper end surface 171 of the active layer 170 is gradually exposed to the outside starting from a portion thereof in the vicinity of the recess 121*b*. As a result, upper end corners of the recess 121*b* in the active layer 170 are chamfered, so that the second corner portions 172 are formed.

Figure 18:
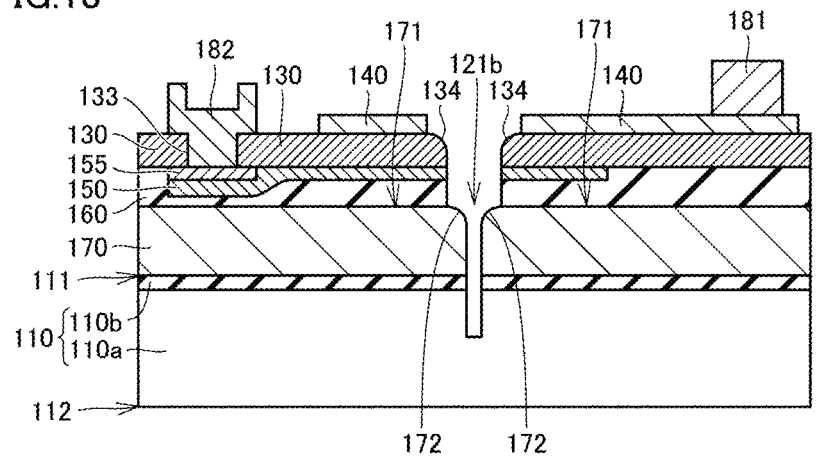
FIG. 18 is a diagram illustrating a state where the recess is extended to a lower base portion in the method for manufacturing the piezoelectric device according to the first preferred embodiment of the present invention.

FIG. 18 is a diagram illustrating a state where the recess is extended to the lower base portion in the method for manufacturing the piezoelectric device according to the first preferred embodiment of the present invention. By performing the dry etching in a state where the photoresist 2 is provided, as illustrated in FIG. 18, the second corner portions 172 are formed, and the recess 121*b* is extended until the bottom surface of the recess 121*b* reaches the inside of the lower base portion 110*a*.

As illustrated in FIG. 17 and FIG. 18, the upper end corners of the recess 121*b* are chamfered, and thus, each of the second corner portions 172 has an external shape that follows the external shape of the upper surface of the portion of the photoresist 2 that is adjacent to the recess 121*b*.

Finally, the cavity 113 is formed in the base portion 110 by performing deep reactive ion etching (Deep RIE) or the like, for example, on the base portion 110 from the side on which the lower main surface 112 of the base portion 110 is present. As a result, in the piezoelectric device 100 according to the present preferred embodiment, the piezoelectric driving portion 120 is formed. Note that the first outer electrode layer 181 and the second outer electrode layer 182 may be provided immediately before the piezoelectric driving portion 120 is formed.

The piezoelectric device 100 according to the first preferred embodiment of the present invention such as that illustrated in FIG. 2 is manufactured through the above-described steps.

As described above, in the piezoelectric device 100 according to the first preferred embodiment of the present invention, the through groove 121 is formed in the piezoelectric driving portion 120 so as to extend through the piezoelectric driving portion 120 in the vertical direction, so that the pair of inner side surfaces 122 are formed. Each of the pair of inner side surfaces 122 includes the first small-width portion 123 in which the width of the through groove 121 gradually decreases in the downward direction from the upper end surface 131 of the piezoelectric layer 130.

As a result, in the piezoelectric driving portion 120, deformation of each portion that faces the through groove 121 is reduced, so that deterioration of the electrical characteristics of the piezoelectric device 100 can be reduced or prevented.

In the piezoelectric device 100 according to the present preferred embodiment, the piezoelectric driving portion 120 is indirectly supported by the base portion 110 and positioned above the base portion 110. In addition, the piezoelectric driving portion 120 does not overlap the base portion 110.

As a result, the piezoelectric driving portion 120 can be structured so as to have a membrane structure. Accordingly, the piezoelectric device 100 can be thin.

In the piezoelectric device 100 according to the present preferred embodiment, the piezoelectric layer 130 includes the first corner portions 134 each of which is contiguous to the upper end surface 131 of the piezoelectric layer 130 and each of which defines at least a portion of the corresponding first small-width portion 123. Each of the first corner portions 134 is curved obliquely upward in a convex manner.

As a result, a large deformation of the piezoelectric layer 130, which is one of the portions of the piezoelectric driving portion 120 that face the through groove 121, is reduced, so that deterioration of the electrical characteristics of the piezoelectric device 100 can be reduced or prevented.

In the piezoelectric device 100 according to the present preferred embodiment, each of the pair of inner side surfaces 122 further includes the second small-width portion in which the width of the through groove 121 gradually decreases in the downward direction from the upper end surface 171 of the active layer 170.

As a result, deformation of a portion below the piezoelectric layer 130, the portion being one of the portions of the piezoelectric driving portion 120 that face the through groove 121, can also be reduced, so that deterioration of the electrical characteristics of the piezoelectric device 100 can be reduced or prevented.

In the piezoelectric device 100 according to the present preferred embodiment, the active layer 170 includes the second corner portions 172 each of which is contiguous to the upper end surface 171 of the active layer 170 and each of which defines at least a portion of the corresponding second small-width portion 124. Each of the second corner portions 172 is curved obliquely upward in a convex manner. The radius of curvature of each of the first corner portions 134 and the radius of curvature of each of the second corner portions 172 are different from each other.

As a result, an optimum radius of curvature of each of the corner portions can be set in order to reduce deformation of the piezoelectric layer 130 and deformation of the active layer 170.

In the piezoelectric device 100 according to the present preferred embodiment, the piezoelectric layer 130 is made of a single-crystal piezoelectric material, for example. The axial direction of the polarization axis of the single-crystal piezoelectric material is inclined with respect to the lamination direction of the piezoelectric driving portion 120.

As a result, the difference between the thermal expansion coefficient of the piezoelectric driving portion 120 in the vertical direction and the thermal expansion coefficient of the piezoelectric driving portion 120 in the planar direction can be reduced, and thus, deterioration of the electrical characteristics of the piezoelectric device 100 can be reduced or prevented.

In the piezoelectric device 100 according to the present preferred embodiment, the axial direction of the polarization axis of the single-crystal piezoelectric material is not perpendicular or substantially perpendicular to the lamination direction of the piezoelectric driving portion 120.

As a result, deterioration of the electrical characteristics of the piezoelectric device 100 can be reduced or prevented, and a reduction in the amount of deformation of the piezoelectric driving portion 120 as a result of a voltage being applied to the piezoelectric driving portion 120 can be reduced or prevented, so that the piezoelectricity of the piezoelectric device 100 can be improved.

In the piezoelectric device 100 according to the present preferred embodiment, the thermal expansion coefficient of the piezoelectric layer 130 in the lamination direction of the piezoelectric driving portion 120 and the thermal expansion coefficient of the piezoelectric layer 130 in the planar direction are different from each other.

As a result, various materials can be used for the piezoelectric layer 130. Note that, in the present preferred embodiment, the pair of inner side surfaces 122 include the first small-width portions 123. Thus, even in the case where the thermal expansion coefficient of the piezoelectric layer 130 differs in the two directions, deformation of each of the portions of the piezoelectric driving portion 120, the portions facing the through groove 121, is reduced, so that deterioration of the electrical characteristics of the piezoelectric device 100 can be reduced or prevented.

Second Preferred Embodiment

A piezoelectric device according to a second preferred embodiment of the present invention will be described below. The differences between the piezoelectric device according to the second preferred embodiment of the present invention and the piezoelectric device 100 according to the first preferred embodiment are the configuration of the through groove and the configuration of the pair of inner side surfaces. Accordingly, repeated descriptions of the components the same as or similar to those in the first preferred embodiment of the present invention will be omitted.

Figure 19:
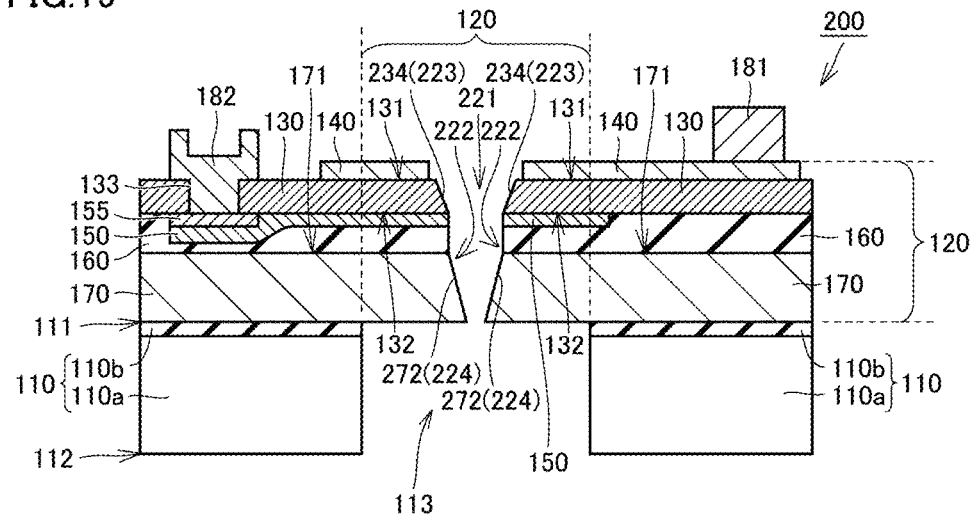
FIG. 19 is a cross-sectional view of a piezoelectric device according to a second preferred embodiment of the present invention.

FIG. 19 is a cross-sectional view of the piezoelectric device according to the second preferred embodiment of the present invention. In FIG. 19, the piezoelectric device is illustrated in the same cross-sectional view as the piezoelectric device 100 illustrated in FIG. 2.

As illustrated in FIG. 19, the piezoelectric layer 130 includes first inclined portions 234 each of which is contiguous to the upper end surface 131 of the piezoelectric layer 130 and each of which defines at least a portion of one of first small-width portions 223. In the present preferred embodiment, the first small-width portions 223 define the entire or substantially the entire portions of a pair of inner side surfaces 222 that are included in the piezoelectric layer 130. In addition, in the present preferred embodiment, each of the first small-width portions 223 may be entirely or substantially entirely defined by the corresponding first inclined portion 234.

Note that each of the first inclined portions 234 may partially define the corresponding first small-width portion 223. In this case, a portion of the first small-width portion 223 that is located below the first inclined portion 234 may be curved obliquely upward in a convex manner.

As illustrated in FIG. 19, the active layer 170 includes second inclined portions 272 each of which is contiguous to the upper end surface 171 of the active layer 170 and each of which defines at least a portion of one of second small-width portions 224. In the present preferred embodiment, the second small-width portions 224 define the entire or substantially the entire portions of the pair of inner side surfaces 222 that are included in the active layer 170. In addition, in the present preferred embodiment, each of the second small-width portions 224 may be entirely or substantially entirely defined by the corresponding second inclined portion 272.

Note that each of the second inclined portions 272 may partially define the corresponding second small-width portion 224. In this case, a portion of the second small-width portion 224 that is located below the second inclined portion 272 may be curved obliquely upward in a convex manner.

A non-limiting example of a method for manufacturing the piezoelectric device according to the second preferred embodiment of the present invention will be described below.

Figure 20:
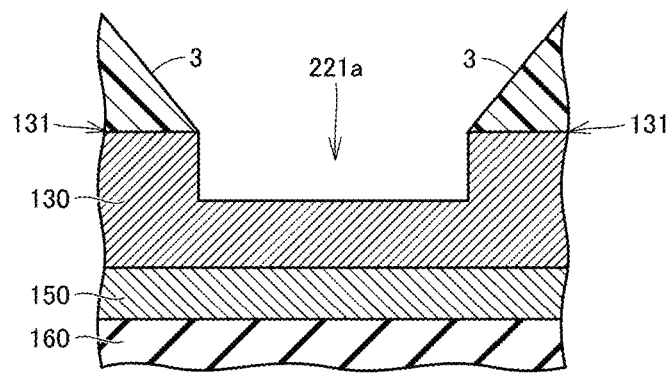
FIG. 20 is an enlarged cross-sectional view of the vicinity of the recess illustrating a state where a photoresist is applied to the upper end surface of the piezoelectric layer in which a recess has been formed in a method for manufacturing the piezoelectric device according to the second preferred embodiment of the present invention.

FIG. 20 is an enlarged cross-sectional view of the vicinity of the recess illustrating a state where a photoresist is applied to the upper end surface of the piezoelectric layer in which a recess has been formed in a method for manufacturing the piezoelectric device according to the second preferred embodiment of the present invention. First, similar to the method for manufacturing the piezoelectric device 100 according to the first preferred embodiment of the present invention, a recess 221a is formed in the piezoelectric layer 130 by etching a portion of the piezoelectric layer 130. After the recess 221a has been formed, a photoresist applied to the piezoelectric layer 130 and the other members in order to perform the etching is removed. Next, as illustrated in FIG. 20, a photoresist 3 is provided on at least portions of the upper end surface 131 of the piezoelectric layer 130 that are adjacent to the recess 221a. The photoresist 3 is not provided in the recess 221a.

As illustrated in FIG. 20, the photoresist 3 includes a through groove that is formed above the recess 221a so as to be contiguous to the recess 221a. The through groove formed in the photoresist 3 includes a portion in which the width of the through groove gradually decreases in the downward direction. In other words, in the surface direction of the upper end surface 131 of the piezoelectric layer 130, the thickness of the photoresist 3 decreases with decreasing distance from the recess 221a.

In the present preferred embodiment, a pair of inner side surfaces are formed in the photoresist 3 as a result of the through groove being formed in the photoresist 3. The pair of inner side surfaces formed in the photoresist 3 are each flat so as to extend obliquely upward in a direction away from the central axis of the through groove.

Next, the depth of the recess 221a is increased by performing dry etching in a state where the photoresist 3 is provided. In addition, in this dry etching, the outer surface of the photoresist 3 is melted. Similar to the photoresist 1 in the first preferred embodiment of the present invention, as a result of the photoresist 3 being melted, upper end corners of the recess 221a are chamfered, so that the first inclined portions 234 are formed.

Figure 21:
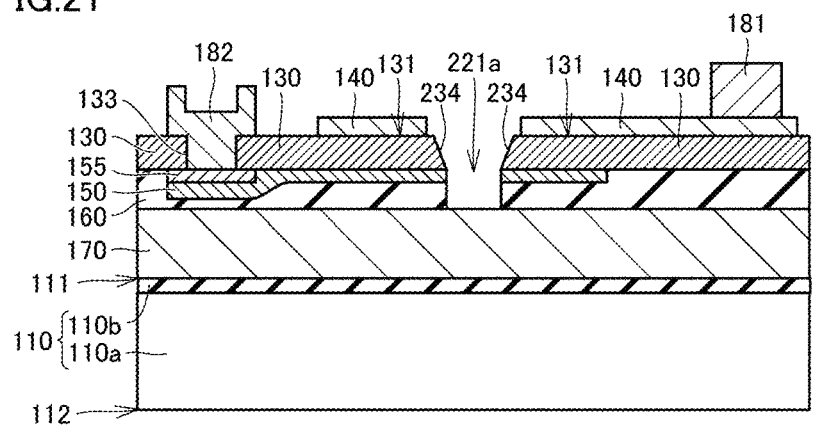
FIG. 21 is a diagram illustrating a state where the recess is extended to the upper end surface of the active layer in the method for manufacturing the piezoelectric device according to the second preferred embodiment of the present invention.

FIG. 21 is a diagram illustrating a state where the recess is extended to the upper end surface of the active layer in the method for manufacturing the piezoelectric device according to the second preferred embodiment of the present invention. By performing the dry etching in a state where the photoresist 3 is provided, as illustrated in FIG. 21, the first inclined portions 234 are formed, and the recess 221a is extended until the recess 221a reaches the upper end surface 171 of the active layer 170.

As illustrated in FIG. 20 and FIG. 21, the upper end corners of the recess 221a are chamfered, and thus, each of the first inclined portions 234 has an external shape that follows the external shape of a portion of the photoresist 3 that is adjacent to the recess 221a.

Figure 22:
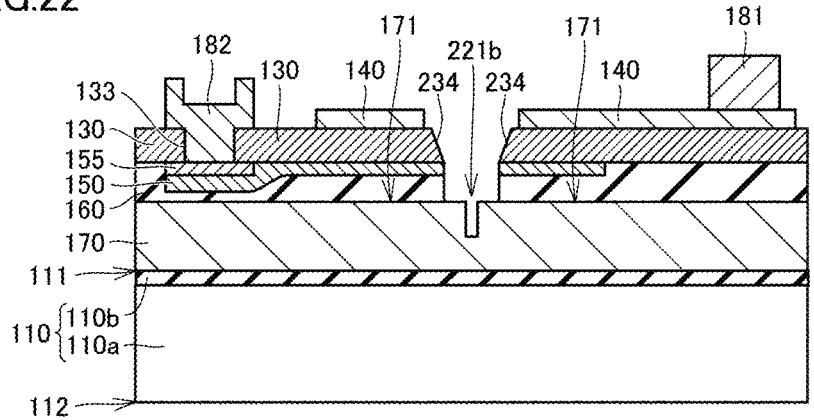
FIG. 22 is a cross-sectional view illustrating a state where a recess is formed in the active layer in order to form a through groove in the method for manufacturing the piezoelectric device according to the second preferred embodiment of the present invention.

FIG. 22 is a cross-sectional view illustrating a state where a recess is formed in the active layer in order to form a through groove in the method for manufacturing the piezoelectric device according to the second preferred embodiment of the present invention. As illustrated in FIG. 22, by etching a portion of the active layer 170 from the upper end surface 171 of the active layer 170 defining or functioning as the bottom surface of the recess 221a, a recess 221b is formed in the active layer 170. The recess 221b corresponds to a portion of a through groove 221 of the piezoelectric device 100 according to the second preferred embodiment of the present invention.

After the recess 221b has been formed in the active layer 170, a resist applied to the active layer 170 and the other members in order to perform the etching is removed.

Figure 23:
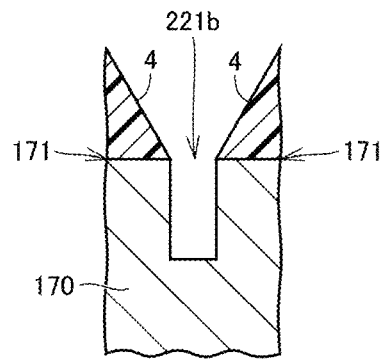
FIG. 23 is an enlarged cross-sectional view of the vicinity of the recess illustrating a state where a photoresist is applied to the upper end surface of the active layer in which the recess has been formed in the method for manufacturing the piezoelectric device according to the second preferred embodiment of the present invention.

FIG. 23 is an enlarged cross-sectional view of the vicinity of the recess illustrating a state where a photoresist is applied to the upper end surface of the active layer in which the recess has been formed in the method for manufacturing the piezoelectric device according to the second preferred embodiment of the present invention. As illustrated in FIG. 23, in the method for manufacturing a piezoelectric device 200 according to the present preferred embodiment, a photoresist 4 is provided on at least portions of the upper end surface 171 of the active layer 170 that are adjacent to the recess 221b. The photoresist 4 is not provided in the recess 221b.

As illustrated in FIG. 23, the photoresist 4 includes a through groove that is formed above the recess 221b so as to be contiguous to the recess 221b. The through groove formed in the photoresist 4 includes a portion in which the width of the through groove gradually decreases in the downward direction. In other words, in the surface direction of the upper end surface 171 of the active layer 170, the thickness of the photoresist 4 decreases with decreasing distance from the recess 221b.

In the present preferred embodiment, a pair of inner side surfaces are formed in the photoresist 4 as a result of the through groove being formed in the photoresist 4. The pair of inner side surfaces formed in the photoresist 4 are each flat so as to extend obliquely upward in a direction away from the central axis of the through groove.

Next, the depth of the recess 221b is increased by performing dry etching in a state where the photoresist 4 is provided. In addition, in this dry etching, the outer surface of the photoresist 4 is melted. Similar to the photoresist 2 in the first preferred embodiment of the present invention, as a result of the photoresist 4 being melted, upper end corners of the recess 221b are chamfered, so that the second inclined portions 272 are formed.

Figure 24:
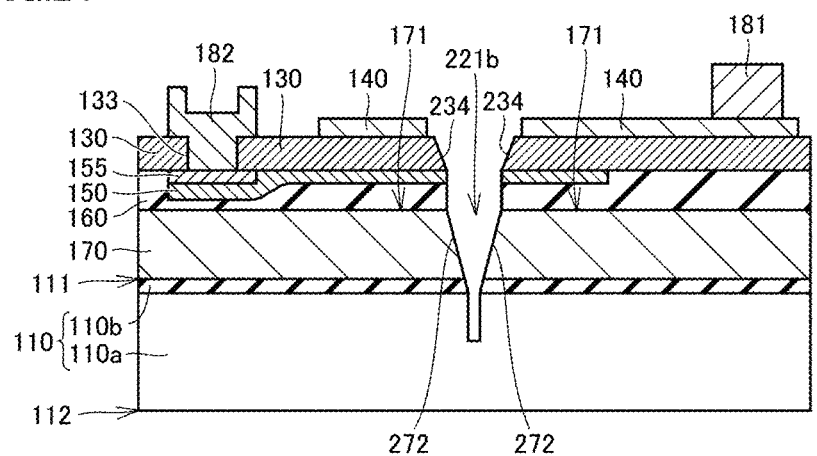
FIG. 24 is a diagram illustrating a state where the recess is extended to the lower base portion in the method for manufacturing the piezoelectric device according to the second preferred embodiment of the present invention.

FIG. 24 is a diagram illustrating a state where the recess is extended to a lower base portion in the method for manufacturing the piezoelectric device according to the second preferred embodiment of the present invention. By performing the dry etching in a state where the photoresist 4 is provided, as illustrated in FIG. 24, the second inclined portions 272 are formed, and the recess 221b is extended until the bottom surface of the recess 221b reaches the inside of the lower base portion 110a.

As illustrated in FIG. 23 and FIG. 24, the upper end corners of the recess 221b are chamfered and thus, each of the second inclined portions 272 has an external shape that follows the external shape of a portion of the photoresist 4 that is adjacent to the recess 221b.

Finally, the cavity 113 is formed in the base portion 110 by performing deep reactive ion etching or the like on the base portion 110 from the side on which the lower main surface 112 of the base portion 110 is present. As a result, in the piezoelectric device 200 according to the present preferred embodiment, the piezoelectric driving portion 120 is formed.

The piezoelectric device 200 according to the second preferred embodiment of the present invention such as that illustrated in FIG. 19 is manufactured through the above-described steps.

As described above, in the piezoelectric device 200 according to the second preferred embodiment of the present invention, the piezoelectric layer 130 includes the first inclined portions 234 each of which is contiguous to the upper end surface 131 of the piezoelectric layer 130 and each of which defines at least a portion of the corresponding first small-width portion 223.

As a result, a large deformation of the piezoelectric layer 130, which is one of the portions of the piezoelectric driving portion 120 that face the through groove 121, is reduced, so that deterioration of the electrical characteristics of the piezoelectric device 100 can be reduced or prevented.

Third Preferred Embodiment

A piezoelectric device according to a third preferred embodiment of the present invention will be described below. The main differences between the piezoelectric device according to the third preferred embodiment of the present invention and the piezoelectric device 100 according to the first preferred embodiment are the configuration of the piezoelectric driving portion and the configuration of a base portion. Accordingly, repeated descriptions of the components the same as or similar to those of the piezoelectric device 100 according to the first preferred embodiment of the present invention will be omitted.

Figure 25:
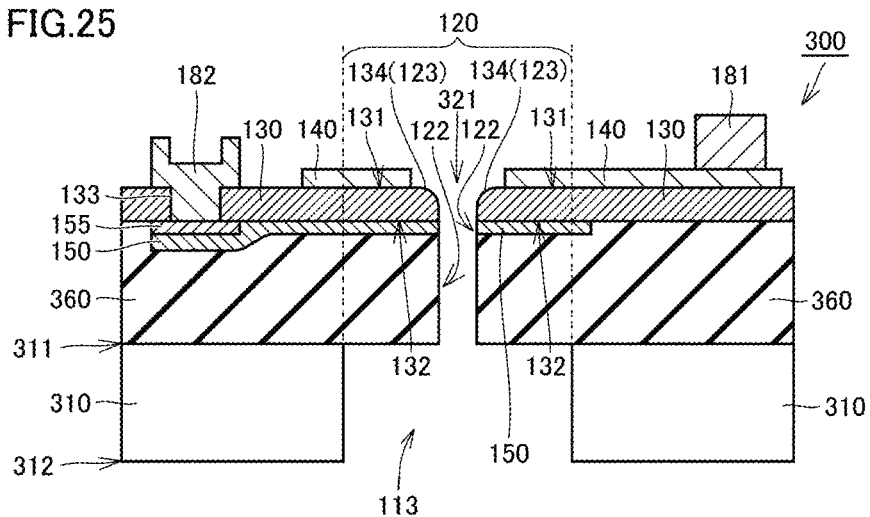
FIG. 25 is a cross-sectional view of a piezoelectric device according to a third preferred embodiment of the present invention.

FIG. 25 is a cross-sectional view of the piezoelectric device according to the third preferred embodiment of the present invention. In FIG. 25, a piezoelectric device 300 is illustrated in the same cross-sectional view as the piezoelectric device 100 illustrated in FIG. 2.

As illustrated in FIG. 25, in the piezoelectric device 300 according to the third preferred embodiment of the present invention, a base portion 310 includes a single layer. The material of the base portion 310 is not particularly limited. In the present preferred embodiment, the base portion 310 is made of Si, for example.

As illustrated in FIG. 25, in the third preferred embodiment of the present invention, an intermediate layer 360 is laminated on the upper main surface 311 of the base portion 310 so as to cover the cavity 113 from above. Thus, in the present preferred embodiment, the lower surface of the intermediate layer 360 is exposed through the cavity 113. As described above, in the present preferred embodiment, the plurality of layers of the piezoelectric driving portion 120 do not include an active layer.

A non-limiting example of a method for manufacturing the piezoelectric device according to the third preferred embodiment of the present invention will be described below.

Figure 26:
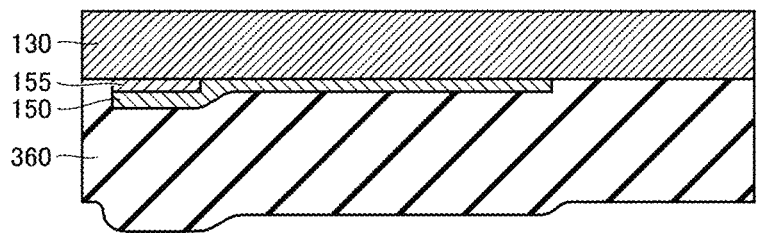
FIG. 26 is a cross-sectional view illustrating a state where an intermediate layer is provided on the lower surface of the lower electrode layer and the lower surface of the piezoelectric layer in a method for manufacturing the piezoelectric device according to the third preferred embodiment of the present invention.

FIG. 26 is a cross-sectional view illustrating a state where an intermediate layer is provided on the lower surface of the lower electrode layer and the lower surface of the piezoelectric layer in the method for manufacturing the piezoelectric device according to the third preferred embodiment of the present invention. First, similar to the method for manufacturing the piezoelectric device 100 according to the first preferred embodiment of the present invention, the etching stop layer 155 and the lower electrode layer 150 are provided below the piezoelectric layer 130. Next, as illustrated in FIG. 26, the intermediate layer 360 is provided on the lower surface of the lower electrode layer 150 and the lower surface of the piezoelectric layer 130 by the CVD method, the PVD method, or the like, for example.

Figure 27:
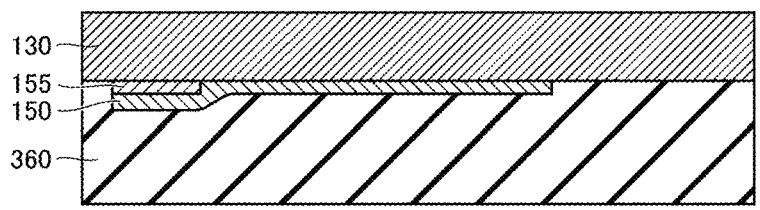
FIG. 27 is a cross-sectional view illustrating a state where the lower surface of the intermediate layer is flat in the method for manufacturing the piezoelectric device according to the third preferred embodiment of the present invention.

FIG. 27 is a cross-sectional view illustrating a state where the lower surface of the intermediate layer is formed flat in the method for manufacturing the piezoelectric device according to the third preferred embodiment of the present invention. As illustrated in FIG. 27, the lower surface of the intermediate layer 360 is formed flat by chemical mechanical polishing or the like, for example.

Figure 28:
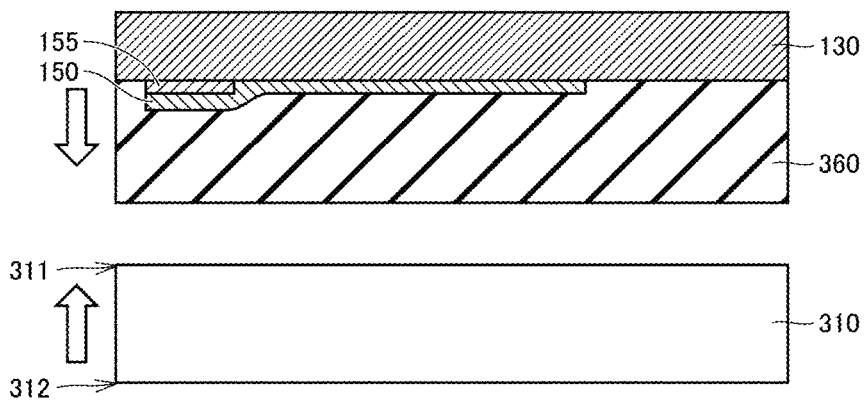
FIG. 28 is a cross-sectional view illustrating a state where a base portion is to be joined to the lower surface of the intermediate layer in the method for manufacturing the piezoelectric device according to the third preferred embodiment of the present invention.
Figure 29:
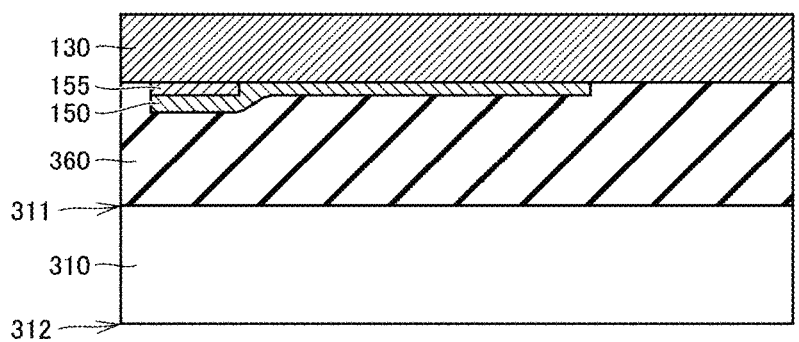
FIG. 29 is a cross-sectional view illustrating a state where the base portion is joined to the lower surface of the intermediate layer in the method for manufacturing the piezoelectric device according to the third preferred embodiment of the present invention.

FIG. 28 is a cross-sectional view illustrating a state where the base portion is to be joined to the lower surface of the intermediate layer in the method for manufacturing the piezoelectric device according to the third preferred embodiment of the present invention. FIG. 29 is a cross-sectional view illustrating a state where the base portion is joined to the lower surface of the intermediate layer in the method for manufacturing the piezoelectric device according to the third preferred embodiment of the present invention.

As illustrated in FIG. 28 and FIG. 29, the base portion 110 is joined to the lower surface of the intermediate layer 360. At this point, the cavity 113 has not yet been formed in the base portion 110.

Figure 30:
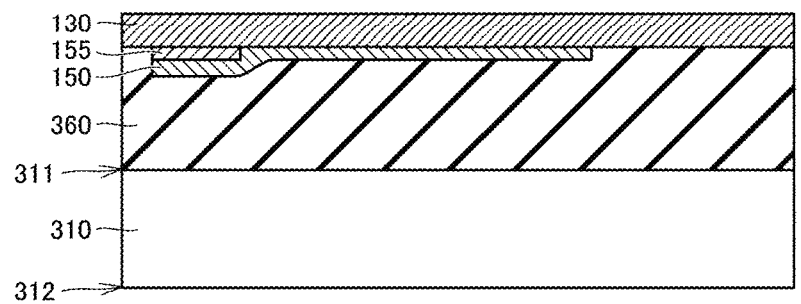
FIG. 30 is a cross-sectional view illustrating a state where the upper surface of the piezoelectric layer is ground in the method for manufacturing the piezoelectric device according to the third preferred embodiment of the present invention.

FIG. 30 is a cross-sectional view illustrating a state where the upper surface of the piezoelectric layer is ground in the method for manufacturing the piezoelectric device according to the third preferred embodiment of the present invention. As illustrated in FIG. 30, the upper surface of the piezoelectric layer 130 is ground by CMP or the like, for example, such that the piezoelectric layer 130 has a desired thickness.

Figure 31:
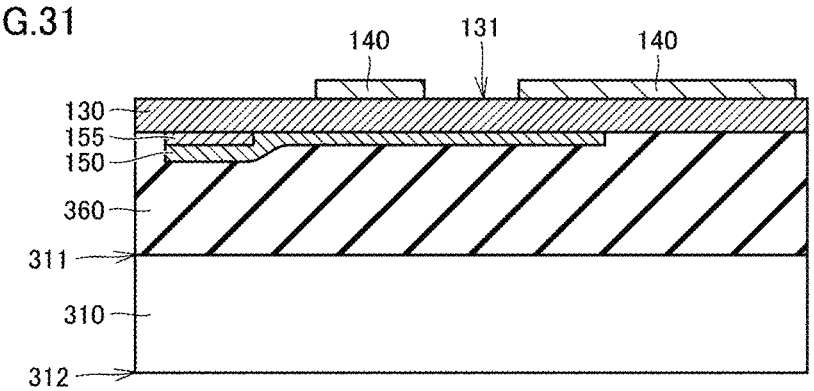
FIG. 31 is a cross-sectional view illustrating a state where the upper electrode layer is provided on the upper end surface of the piezoelectric layer in the method for manufacturing the piezoelectric device according to the third preferred embodiment of the present invention.

FIG. 31 is a cross-sectional view illustrating a state where the upper electrode layer is provided on the upper end surface of the piezoelectric layer in the method for manufacturing the piezoelectric device according to the third preferred embodiment of the present invention. As illustrated in FIG. 31, the upper electrode layer 140 is provided on a portion of the upper surface of the piezoelectric layer 130 by the lift-off method, the plating method, the etching method, or the like, for example.

Figure 32:
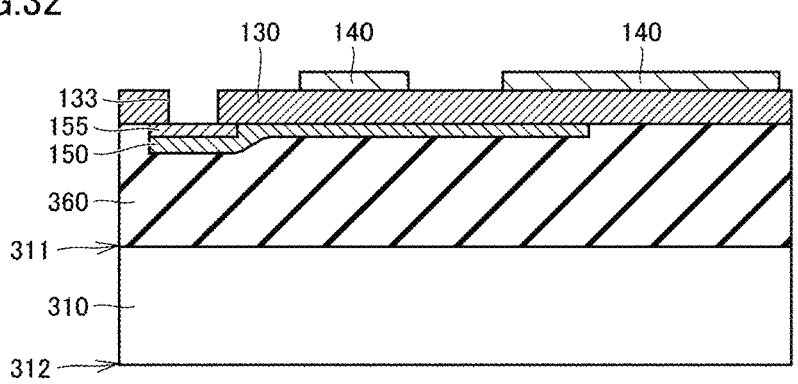
FIG. 32 is a cross-sectional view illustrating a state where a hole is formed in the piezoelectric layer in the method for manufacturing the piezoelectric device according to the third preferred embodiment of the present invention.

FIG. 32 is a cross-sectional view illustrating a state where a hole is formed in the piezoelectric layer in the method for manufacturing the piezoelectric device according to the third preferred embodiment of the present invention. As illustrated in FIG. 32, the hole 133 is formed by etching a portion of the piezoelectric layer 130.

Figure 33:
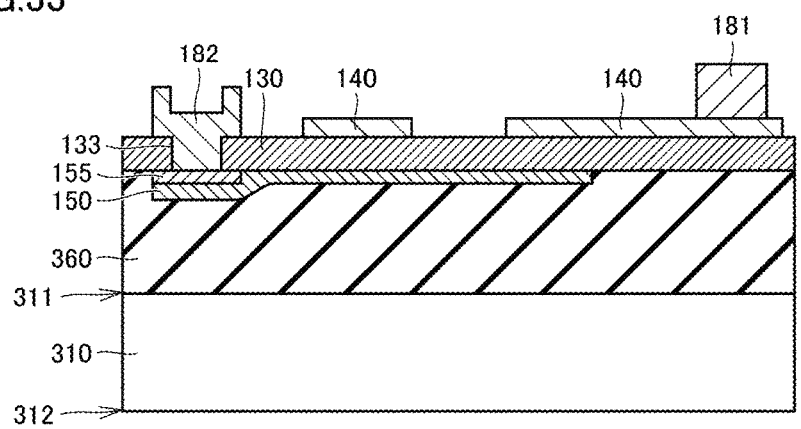
FIG. 33 is a cross-sectional view illustrating a state where the first outer electrode layer and the second outer electrode layer are provided in the method for manufacturing the piezoelectric device according to the third preferred embodiment of the present invention.

FIG. 33 is a cross-sectional view illustrating a state where the first outer electrode layer and the second outer electrode layer are provided in the method for manufacturing the piezoelectric device according to the third preferred embodiment of the present invention. As illustrated in FIG. 33, the first outer electrode layer 181 and the second outer electrode layer 182 are each provided by the lift-off method, the plating method, the etching method, or the like, for example.

Figure 34:
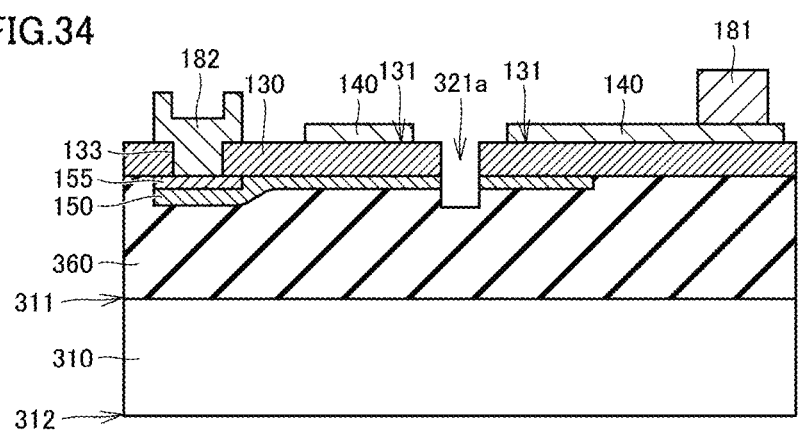
FIG. 34 is a cross-sectional view illustrating a state where a recess is formed in the piezoelectric layer in order to form a through groove in the method for manufacturing the piezoelectric device according to the third preferred embodiment of the present invention.

FIG. 34 is a cross-sectional view illustrating a state where a recess is formed in the piezoelectric layer in order to form a through groove in the method for manufacturing the piezoelectric device according to the third preferred embodiment of the present invention. As illustrated in FIG. 34, a recess 321a is formed in the piezoelectric layer 130 by etching a portion of the piezoelectric layer 130. The recess 321a corresponds to a portion of a through groove 321 of the piezoelectric device 300 according to the present preferred embodiment.

After the recess 321a has been formed in the piezoelectric layer 130, a photoresist applied to the piezoelectric layer 130 and the other members in order to perform the above-mentioned etching is removed.

Note that, in the present preferred embodiment, although the recess 121a is formed such that the recess 121a extends through the piezoelectric layer 130 and the lower electrode layer 150 and that the bottom surface of the recess 121a reaches the intermediate layer 360 in order to form the through groove 321, the recess 121a may be formed only in the piezoelectric layer 130.

Figure 35:
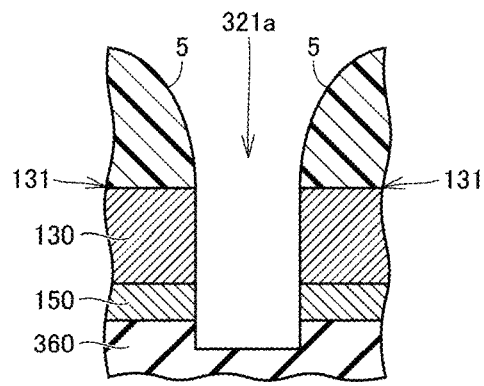
FIG. 35 is an enlarged cross-sectional view of the vicinity of the above-mentioned recess illustrating a state where a photoresist is applied to the upper end surface of the piezoelectric layer in which the recess has been formed in the method for manufacturing the piezoelectric device according to the third preferred embodiment of the present invention.

FIG. 35 is an enlarged cross-sectional view of the vicinity of the recess illustrating a state where a photoresist is applied to the upper end surface of the piezoelectric layer in which the recess has been formed in the method for manufacturing the piezoelectric device according to the third preferred embodiment of the present invention. As illustrated in FIG. 35, in the method for manufacturing the piezoelectric device 300 according to the present preferred embodiment, a photoresist 5 is provided on at least portions of the upper end surface 131 of the piezoelectric layer 130 that are adjacent to the recess 321a. The photoresist 5 is not provided in the recess 321a.

As illustrated in FIG. 35, the photoresist 5 includes a through groove that is formed above the recess 321a so as to be contiguous to the recess 321a. The through groove formed in the photoresist 5 includes a portion in which the width of the through groove gradually decreases in the downward direction. In other words, in the surface direction of the upper end surface 131 of the piezoelectric layer 130, the thickness of the photoresist 5 decreases with decreasing distance from the recess 121a.

In the present preferred embodiment, a pair of inner side surfaces are formed in the photoresist 5 as a result of the through groove being formed in the photoresist 5, and the pair of inner side surfaces formed in the photoresist 5 each include a portion that is curved obliquely upward in a convex manner.

Next, the depth of the recess 321a is increased by performing dry etching in a state where the photoresist 5 is provided. In addition, in this dry etching, the outer surface of the photoresist 5 is melted. Similar to the photoresist 1 in the first preferred embodiment of the present invention, as a result of the photoresist 5 being melted, upper end corners of the recess 321a in the piezoelectric layer 130 are chamfered, so that the first corner portions 134 are formed.

Figure 36:
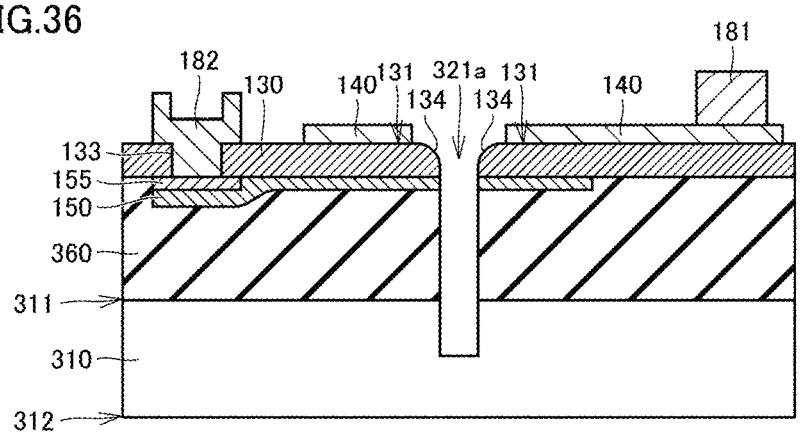
FIG. 36 is a diagram illustrating a state where the recess is extended to the base portion in the method for manufacturing the piezoelectric device according to the third preferred embodiment of the present invention.

FIG. 36 is a diagram illustrating a state where the recess is extended to the base portion in the method for manufacturing the piezoelectric device according to the third preferred embodiment of the present invention. By performing the dry etching in a state where the photoresist 5 is provided, as illustrated in FIG. 36, the first corner portions 134 are formed, and the recess 321a is extended until the bottom surface of the recess 321a reaches the inside of the base portion 310.

As illustrated in FIG. 35 and FIG. 36, the upper end corners of the recess 321a are chamfered, and thus, each of the first corner portions 134 has an external shape that follows the external shape of a portion of the photoresist 5 that is adjacent to the recess 321a.

Finally, the cavity 113 is formed in the base portion 310 by performing deep reactive ion etching or the like, for example, on the base portion 310 from the side on which a lower main surface 312 of the base portion 310 is present. As a result, in the piezoelectric device 300 according to the present preferred embodiment, the piezoelectric driving portion 120 is formed. Note that the first outer electrode layer 181 and the second outer electrode layer 182 may be provided immediately before the piezoelectric driving portion 120 is formed.

The piezoelectric device 300 according to the third preferred embodiment of the present invention such as that illustrated in FIG. 25 is manufactured through the above-described steps.

As described above, also in the piezoelectric device 300 according to the third preferred embodiment of the present invention, each of the pair of inner side surfaces 122 has the first small-width portion 123 in which the width of the through groove 321 gradually decreases in the downward direction from the upper end surface 131 of the piezoelectric layer 130. As a result, in the piezoelectric device according to the third preferred embodiment of the present invention, deformation of each of the portions of the piezoelectric driving portion 120 that face the through groove 321 is reduced, so that deterioration of the electrical characteristics of the piezoelectric device 300 can be reduced or prevented.

In the above-described preferred embodiments, the configurations which can be combined with one another, may be suitably combined with one another.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a base portion; and
a piezoelectric driving portion directly or indirectly supported by the base portion and including a plurality of layers; wherein
the piezoelectric driving portion includes a piezoelectric layer, an upper electrode layer on an upper side of the piezoelectric layer, and a lower electrode layer facing at least a portion of the upper electrode layer with the piezoelectric layer interposed between the lower electrode layer and the upper electrode layer;
the piezoelectric driving portion includes a through groove extending through the piezoelectric driving portion in a vertical direction, so that a pair of inner side surfaces are provided;
the pair of inner side surfaces each include a first small-width portion in which a width of the through groove decreases in a downward direction from an upper end surface of the piezoelectric layer; and
the width of the through groove decreases in a varying manner from an upper end of the through groove toward a lower end of the through groove in the vertical direction.

2. The piezoelectric device according to claim 1, wherein
the piezoelectric driving portion is indirectly supported by the base portion and is positioned above the base portion; and
the piezoelectric driving portion does not overlap the base portion.

3. The piezoelectric device according to claim 1, wherein
the piezoelectric layer includes first corner portions each of which is contiguous to the upper end surface of the piezoelectric layer and each of which defines at least a portion of one of the first small-width portions; and
each of the first corner portions is curved obliquely upward in a convex manner.

4. The piezoelectric device according to claim 1, wherein the piezoelectric layer includes first inclined portions each of which is contiguous to the upper end surface of the piezoelectric layer and each of which defines at least a portion of one of the first small-width portions.

5. The piezoelectric device according to claim 1, wherein
the piezoelectric driving portion includes an active layer below the lower electrode layer and the piezoelectric layer; and
each of the pair of inner side surfaces includes a second small-width portion in which the width of the through groove decreases in the downward direction from an upper end surface of the active layer.

6. The piezoelectric device according to claim 3, wherein
the piezoelectric driving portion includes an active layer positioned below the lower electrode layer and the piezoelectric layer;
each of the pair of inner side surfaces includes a second small-width portion in which the width of the through groove decreases in the downward direction from an upper end surface of the active layer;
the active layer includes second corner portions each of which is contiguous to the upper end surface of the active layer and each of which defines at least a portion of one of the second small-width portions;
each of the second corner portions is curved obliquely upward in a convex manner; and
a radius of curvature of each of the first corner portions and a radius of curvature of each of the second corner portions are different from each other.

7. The piezoelectric device according to claim 1, wherein
the piezoelectric layer is made of a single-crystal piezoelectric material; and
an axial direction of a polarization axis of the single-crystal piezoelectric material is inclined with respect to a lamination direction of the piezoelectric driving portion.

8. The piezoelectric device according to claim 7, wherein the axial direction of the polarization axis of the single-crystal piezoelectric material is not perpendicular or substantially perpendicular to the lamination direction of the piezoelectric driving portion.

9. The piezoelectric device according to claim 1, wherein a thermal expansion coefficient of the piezoelectric layer in the lamination direction of the piezoelectric driving portion and a thermal expansion coefficient of the piezoelectric layer in a planar direction are different from each other.

10. The piezoelectric device according to claim 1, wherein the piezoelectric layer includes a hole extending through the piezoelectric layer and being positioned above the base portion.

11. The piezoelectric device according to claim 1, wherein the piezoelectric layer is made of lithium tantalate or lithium niobate.

12. The piezoelectric device according to claim 10, wherein a portion of the lower electrode layer is positioned below the hole.

13. The piezoelectric device according to claim 1, wherein the lower electrode layer is connected to the piezoelectric layer via an etching stop layer.

14. The piezoelectric device according to claim 1, wherein the lower electrode layer is made of Pt, Ni, or Au.

15. The piezoelectric device according to claim 1, further comprising an intermediate layer in contact with a lower surface of the lower electrode layer and a portion of the piezoelectric layer not covered by the lower electrode layer.

16. The piezoelectric device according to claim 15, wherein the intermediate layer is made of $SiO_2$.

* * * * *